324-77
SR
9/8/87 XR 4,692,722

United States Patent [19]

Reichel, deceased et al.

[11] Patent Number: 4,692,722

[45] Date of Patent: Sep. 8, 1987

[54] COMPACT FREQUENCY DISPERSIVE BULK ACOUSTIC WAVE CHANNELIZER

[75] Inventors: Paul Reichel, deceased, late of New York; Gilbert Reichel, administrator, Woodbury, both of N.Y.

[73] Assignee: Loral Corporation, Yonkers, N.Y.

[21] Appl. No.: 660,491

[22] Filed: Oct. 12, 1984

[51] Int. Cl.[4] .............................................. H03H 9/40

[52] U.S. Cl. .................................. 333/142; 333/144; 333/149; 333/187; 324/77 B; 310/320; 310/366; 310/367

[58] Field of Search ............... 333/187, 188, 141, 142, 333/144, 145, 147, 149; 310/320, 335, 367, 366, 365; 324/77 B

[56] References Cited

U.S. PATENT DOCUMENTS

| | | | |
|---|---|---|---|
| 3,252,722 | 5/1966 | Allen | 333/147 X |
| 3,293,574 | 12/1966 | Baum | 333/142 |
| 3,300,739 | 1/1967 | Mortley | 333/142 X |
| 3,369,199 | 2/1968 | Sittig | 333/149 |
| 3,378,793 | 4/1968 | Mortley | 333/142 |
| 3,387,233 | 6/1968 | Parker, Jr. | 333/149 |
| 3,387,235 | 6/1968 | Fair | 333/141 |
| 3,518,582 | 6/1970 | Pizzarello et al. | 333/142 |
| 3,573,669 | 4/1971 | Papadakis | 333/147 |
| 3,582,834 | 6/1971 | Evans | 333/142 |
| 4,074,213 | 2/1978 | Epsztein et al. | 333/187 |
| 4,292,608 | 9/1981 | Weinert et al. | 333/147 |
| 4,350,917 | 9/1982 | Lizzi et al. | 310/320 |
| 4,499,393 | 2/1985 | Stokes et al. | 310/313 A |

FOREIGN PATENT DOCUMENTS

| | | | |
|---|---|---|---|
| 2087676 | 5/1982 | United Kingdom | 333/141 |

OTHER PUBLICATIONS

Chang; "Acoustooptic Devices and Application"; *IEEE Transactions on Sonics and Ultrasonics;* vol. SU-23, No. 1, Jan. 1973; pp. 1-22.

Hecht; "Multifrequency Acoustooptic Diffraction"; IEEE Transactions on Sonics & Ultrasonics; vol. SU-24, No. 1, Jan. 1977; pp. 1-18.

Dixon; "Acoustic Diffraction of Light in Anisotropic Media"; *IEEE Journal on Quantum Electronics;* QE N2, Feb. 1967, pp. 85-93.

Gordon; A Review of Acoustooptical Deflection & Modulation Devices, *Applied Optics;* vol. 5, #10, Oct. 1969.

*Primary Examiner*—Eugene R. LaRoche
*Assistant Examiner*—Benny T. Lee
*Attorney, Agent, or Firm*—Charles E. Temko

[57] ABSTRACT

The disclosure relates to a small volume bulk acoustic channelizer, which does not utilize light and thereby avoids the shortcomings of light-related channelizers including limited dynamic range and poor response to short pulses. The device is essentially a bulk acoustic analogue of an optical spectroscope.

1 Claim, 10 Drawing Figures

COMPACT FREQUENCY DISPERSIVE BULK ACOUSTIC WAVE CHANNELIZER

BACKGROUND OF THE INVENTION

This invention relates generally to the field of radio frequency channelizers used for splitting a received broad band signal into a plurality of signals of lesser band-width. More particularly, the invention is directed to an improved channelizer of acoustic type which does not utilize light.

Much of the equipment used in the prior art includes so-called Bragg cell channelizers, and/or integrated acousto-optic channelizers. Both types of devices present two major problems, namely limited dynamic range and poor response to short pulses. Both of these problems are light-related. The excessive noise of photoarrays is the main cause of the dynamic range limitation, while shorter ultrasonic pulses, because they intercept only part of the laser beam diameter, distribute light more widely in the spectral plane, and thus deliver weak signals to the photoarray.

SUMMARY OF THE INVENTION

The invention contemplates the provision of an improved device which avoids the above mentioned shortcomings, which, in essence, is a small volume bulk acoustic channelizer which does not utilize light and thereby avoids the above mentioned problems in addition to avoiding the complexity and stability problems of Bragg cells. The device is essentially a bulk acoustic analogue of an optical spectroscope.[1]

1. This differs fundamentally from spectral analysis using bulk acoustic spatial filtering. A method of bulk acoustic spatial filtering has been described by R. E. Brooks in Applied Optics, 22, 2801, 1983.

A frequency steered ultrasonic array generates a bulk acoustic wave replica of the RF or IF signal. Frequency separation is achieved essentially because the different frequency components of an accoustic beam formed by such an array will propagate in different directions.

The device, in one form, consists of a bulk acoustic medium, e.g. a lithium niobate crystal, with both the frequency-steered sources array and the receptor array deposited at locations on opposed surfaces of the medium. Focusing of the bulk acoustic beam is required and this is accomplished by appropriately curving the surface on which the frequency steered array is deposited. In another embodiment, a plane, non-beam steering electric-to-acoustic transducer is used to send an ultrasonic beam against a concave flared reflection grating. As the frequency of the incident beam changes, the reflection grating will send it in different directions.

BRIEF DESCRIPTION OF THE DRAWINGS

In the drawings, to which reference will be made in the specification.

DETAILED DESCRIPTION OF THE DISCLOSED EMBODIMENTS

Figure 1:
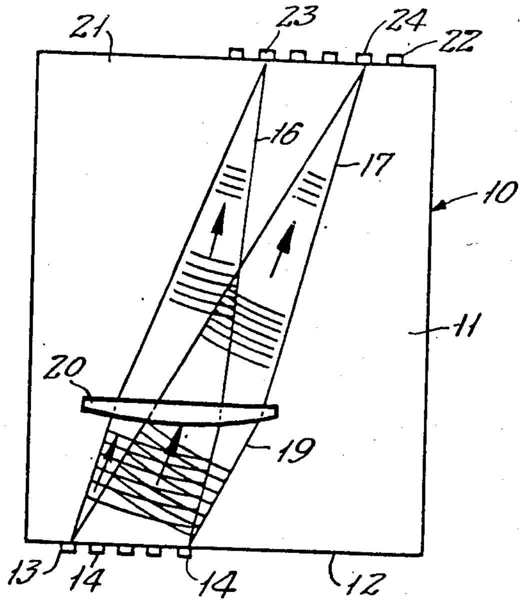
FIG. 1 is a schematic view illustrating the basic concept of a first embodiment of the invention.

Before entering into a consideration of the structural aspects of the disclosed embodiments, a review of the theory involved is considered apposite.

The overall objective of the invention is to provide a device which will permit the advantage of processing a wide instantaneous bandwidth without the disadvantage of time coincident events interfering with each other over a 60 db dynamic range.

The bulk acoustic device disclosed herein provides improved channelization performance in a manner more practical to implement than is possible under current technology. In particular, the disclosed embodiments are capable of dynamic ranges of at least 55–60 db and short pulse sensitivity down to 100 nanoseconds.

The noise and complexity difficulties characteristic of Bragg cell systems, as has been mentioned, arise largely from the optical rather than the ultrasonic aspects of such devices. As a result, it is preferrable to develop an all-acoustic device, in which light beams are not involved, for obtaining Fourier transforms. The basic rational of such a device may be illustrated as follows:

By using a beam steering acoustic transducer array, a bulk acoustic beam is produced which propagates in a direction which varies with frequency, much as is done in some Bragg cells to achieve approximate tracking of the Bragg angle with frequency.

An acoustic lens focuses such beams on an array of acoustic receptor transducers. Acoustic beams travelling in different directions are focused on different receptor elements; each element corresponding to a specific RF frequency. Focusing can alternatively be accomplished by use of a curved reflector or by curving the surface on which the beam steering array is placed. These concepts are illustrated schematically in FIGS. 1 and 2.

Different ultrasonic frequency components travel as collimated beam in different directions so that, when these are focused, they arrive at different respective locations in the spectral plane. The device is thus seen to be an acoustic counterpart of an optical spectroscope.

As in the case of a Bragg cell, the medium used must have low acoustic attenuation at GHz frequencies. The only materials which have been found to have low acoustic attenuation at GHz frequencies are some of the crystal materials.

However, the problem of acoustic focusing is complicated by the fact that crystalline media are almost always acoustically anisotropic even if the crystal is optically isotropic. Different parts of an acoustic converging spherical wavefront will travel at different speeds, according to the local orientation of the front, so that sphericity is lost and a high resolution focus will not result.

Fortunately, crystal classes belonging to the hexagonal system do have acoustic isotropy in two dimensions. Specifically, there is isotropy for acoustic waves if they all travel in directions perpendicular to the axis of hexagonal symmetry. This means that we can have acoustic isotropy, and therefore high resolution focusing, provided a hexagonal crystal is used and the acoustic waves are limited to propagate in two dimensions.

Figure 2:
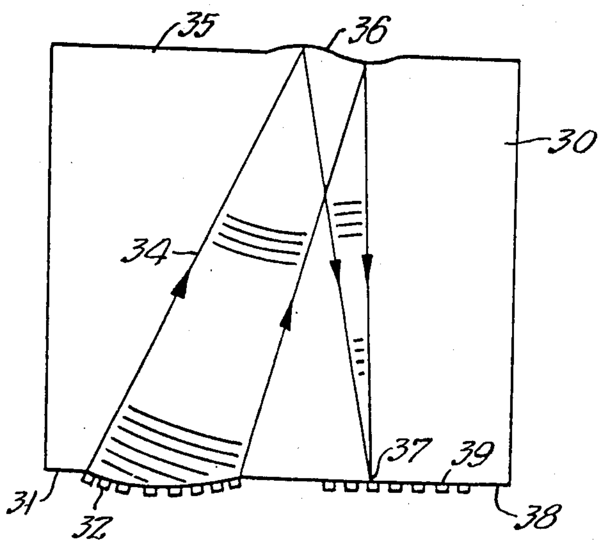
FIG. 2 is a schematic view corresponding in most respect to that seen in FIG. 1, but showing a somewhat altered configuration of an acoustic medium.

In FIGS. 1 and 2, the crystal axis of hexagonal symmetry would be normal to the page while the lens and mirror surfaces in these Figures would be cylinders with axes normal to the page. The transducer elements of both the generating and receiving arrays would be line structures normal to the page.

One acoustic loss hexagonal crystal which is suitable is sapphire ($Al_2O_3$). This material can be fabricated as a highly uniform monocrystal of large dimensions, (e.g., even as a six inch cube). Another suitable substance, lithium niobate ($LiNbO_3$) has still lower acoustic losses and is described by various authors as rhombohedral, one of the classes within the hexagonal system. However, this substance is also well known to be piezoelectric. Thus, the possibility that lithium niobate can be used requires further examination. This complication is due to the fact that a lithium niobate crystal consists of two species of microcrystals.

A factor which also must be considered is the fact that cylindrical waves have the property of diffusion. Specifically, if the envelope of a pulse has a sharp rise or fall time, the envelope will tend to lose this steepness if the pulse is propagating as a cylindrical wave. This is true even if the medium is non-dispersive and lossless. Waves propagating in one or three dimensions do not have diffusion if there is no dispersion or attenuation.

The possibility that cylindrical ultrasonic pulses having rise times and durations of practical interest can exhibit that significant diffusion is present. If the diffusion proves to be objectionable, it can be reduced by modifying the beam steering array geometry so that the wave fronts are nearer to being spherical. Although greater sphericity may introduce some increased insertion loss, the regions of the wavefront that propagate normally to the crystal axis of hexagonal symmetry would maintiain acoustic isotropy.

The above mentioned crystals, sapphire and lithium niobate are both used in Bragg cells as well as in acoustic delay lines, so that the techniques for utilizing them in connection with ultrasonic applications are well developed. This fact is an important consideration in determining the materials to be used.

There is a theoretical possibility, presently not investigated, that some crystals of the cubic system exist which are almost acoustically isotropic in all three dimensions. Not included in this group are polycrystalline conglomerations which are macroscopically isotropic due to the random orientations of the microcrystals.

Such polycrystals are almost certain to have high ultrasonic attentuation. These crystals would permit a choice between two or three dimensional wave devices. One low attenuation crystal which is notably close to being acoustically isotropic in three dimensions is yttrium-aluminum-garnet (YAG). However, a theoretical analysis must be conducted to determine if it is sufficiently isotropic for the present application.

Frequency-steered ultrasonic arrays have been used in some Bragg cells in order that the ultrasonic beam direction can be made to approximately track the Bragg angle. Commercially available are Bragg cells using beam steering arrays on a fabricate-to-order basis, although these devices are not currently available off the shelf.

Such commercially available arrays are made by a planar technology, and normally lose at least 3 db of their radiated power by radiating into other orders. This is readily understood if one considers the type of array which is most practical to implement, in which each element of the linear array is 180° out of time phase with its adjacent elements. Any pair of adjacent elements will produce no net radiation in the direction perpendicular to the plane of the array since the elements are mutually out of phase. Therefore, there is no wasted power due to the radiation into a non-dispersive zero ordr spectrum. Since neighboring array elements are phased 180° apart, radiation from two such elements will reinforce in a direction such that the wavefront from one element must travel a distance of $\lambda/2$ further than the wavefront from the other element (in order to define a common plane wavefront), $\lambda$ is defined as the acoustic wave length in the medium of propagation. Since the incremental travel distance between radiation from neighboring elements is $\lambda/2$, this may conveniently be described as a spectrum of "order $\frac{1}{2}$". By symmetry, an equal amount of radiated energy enters the spectrum of "order-$\frac{1}{2}$" and, since both spectra cannot be used simultaneously, a power loss of at least 3 db is inevitable.

If the radiating elements are centered more than $3\lambda/2$ apart, higher order spectra will appear, e.g., orders of $\pm 3/2$, $\pm 5/2$, etc., in addition to the orders $\frac{1}{2}$. However, this does not mean that the radiating elements must necessarily be spaced less than $3\lambda/2$ apart, (for example, if the radiating elements were centered $5\lambda$ apart with gaps between adjacent elements of $\lambda$). Therefore, each elements constitutes a radiating aperature $4\lambda$ wide so that the element, by itself, radiates a main lobe centered in the direction perpendicular to the plane of the array and of angular width equal to $$\sim \frac{\Lambda}{4\Lambda} = 0.25 \text{ radian.}$$

Two such adjacent elements will cancel out the radiation of each other in the direction precisely perpendicular to the plane of the array.

From this, it follows that spectral orders having directions more than 0.125 rad from the array plane perpendicular will fall outside of the main lobe and will carry much less radiated power than spectra with directions well within the main lobe. The order $\pm\frac{1}{2}$ spectra have directions given by:

$$(\sin\theta) \pm \tfrac{1}{2} \text{ order} = \frac{\Lambda}{2d}. \tag{1}$$

where $\theta$ is the angle the spectral beam makes with the array plane perpendicular and d is the center to center spacing between radiating array elements. If, corresponding to the example considered, a value of $d=5\lambda$, sin $\theta$ becomes $\pm 0.1$, so that $\theta \sim \pm 0.1$ radian. The $\pm\frac{1}{2}$ order spectra are seen to fall within the main radiation lobe of an array element. On the other hand, the next higher spectral orders, being the ±3/2 orders, have sin $\theta$ given by:

$$(\sin\theta) \pm 3/2 \text{ order} = \pm\frac{3\Lambda}{2d} = \pm 0.3. \quad (2)$$

These values of $\theta$ fall far outside of the main lobe and carry far less radiated power than the $\pm\frac{1}{2}$ orders.

The above example shows that one is not limited to an array element spacing d which precludes higher spectral orders. This is a prime consideration, because it is important that a user be free to select the array angular dispersion $d\theta/d\lambda$, which varies approximately as $d^{-1}$ (as is seen by differentiating the above expression for $(\sin\theta)\pm\frac{1}{2}$ order).

Using the order $\frac{1}{2}$ spectrum, other orders would not overlap it for frequency ranges of interest. The order $\frac{1}{2}$ spectrum is free from overlap by the next spectral order (order 3/2) over a 3 to 1 frequency range. It is necessary that there be no overlap, even though the other orders are weak, because of the large dynamic range requirement contemplated by the present disclosure.

In addition to possibly having d values quite different from previous beam steering arrays (where d values are selected on the basis of tracking the Bragg angle as closely as possible), it is also desirable to apodize the overall array by appropriately tapering its radiation. A radiation lobe approaching a Gaussian distribution in angle, rather than a (sin x)/x distribution, is preferable in order to permit a large dynamic range btween nearby frequencies. This will, of course, add some degree of complication to the array design, whatever way the taper may be implemented.

For better conceptual clarity, the array has been discussed as though it were on a plane surface. It is actually on a curved surface so that the acoustic spectral lines will be focused. That the plane surface discussion is applicable is understandable if it is observed that the array situated on a curve surface is quite equivalent to having it on a plane surface and immediately followed by an acoustic focusing lens.

The present invention contemplates an alternative to using a beam steering array. A plane, non-beam steering electric-to-acoustic transducer may be used to send an ultrasonic beam against a concave flared reflection grating (echelette grating) which forms part of the bounding surface of the ultrasonic medium. As the frequency of the incident beam changes, the reflection grating will send it in different directions. The geometric details are identical with the standard treatment of concave optical diffraction gratings, and need not be further considered herein.

In using this alternative construction, the flared diffraction gratings are formed by acid etching and ion beam etching.[2]

2. 1978 Ultrasonics Symposium Proceedings, IEEE Cat. 78CH1344-1SU.

In another form, the grating is formed by depositing several layers on the surface of the ultrasonic medium of a material close in acoustic impedance to the medium itself. The successive layers are dimensioned in an area so as to approximate a flared grating.

By varying the dimensions and shapes of the receptor transducers in the Fourier transform plane, it is possible to vary the frequency response of the receptor. This occurs in two ways. Firstly, the equivalent circuit parameters are changed by shape variations. For example, a transducer element may consist essentially of two smalll conducting parallel plates with a piezoelectric material between them, so that a change in the area of these plates results in a change in, at least, an equivalent circuit capacitance. Secondly, a receptor transducer, being at the Fourier transform plane, can have its range of input frequencies varied by varying its physical dimensions along the direction of the frequency change. (The transducer dimensions in the perpendicular direction of constant frequency can be correspondingly adjusted so as to maintain an unchanged surface area, if desired.) Examples of tranducer input frequency range manipulation by varying its dimensions in the "frequency change direction", as well as some related effects are shown in FIG. 5. This shaping of the receptor element constitutes special filtering of the Fourier transform.

The output of these receptor transducers give a coherent output (for a given frequency, the IF electrical signal from the receptor transducers preserves phase information), and also the output of these transducers are at IF frequency, not video.

The receptor geometry is selected, in particular, so as to facilitate finding the frequency centroid of a narrow band signal. As has been mentioned supra, the second shortcoming of Bragg cells is short pulse insensitivity. As pulses become shorter than the laser beam diameter, Bragg cell response falls off very rapidly. In addition to the shorter pulse spreading diffracted energy "thinner" due to its wider spectrum, detailed phase considerations show the total spectra energy falls off even faster than does the fraction of the light beam intercepted by the pulse. The all acoustic device does not suffer from an effect corresponding to the incomplete interception of the laser beam in a Bragg cell. However, like the Bragg cell, the all acoustic device is affected by the energy of a narrow pulse being "thinned out" due to a wider spectral distribution. This would also be true of a filter bank channelizer.

The main sensitivity and dynamic range limitation in Bragg cells is due to photoarray electronic noise. Solid state photo array systems are much noisier than some corresponding vacuum tube type sensors. For example intensified vidicons can approach single photon shot noise performance; while, in practice, both CCD and photodiode arrays have sensitivities no better than about 500 electrons (500 photocarriers). The vacuum devices, however, have the disadvantage of greater size and higher voltages, requiring separate processing to correct for poor geometric accuracy inherent in electron beam scan readout, devices.

One of the inadequacies of solid state photoarrays can be demonstrated by considering the optical power that is needed for adequate dynamic range bandwidth. For the sake of illustration, an array may be assumed to have the unrealistically large dynamic range of 60 db. Assume a minimum detectable signal of 500 photocarriers and a laser light wavelength of $0.6238\mu$. Assume further (optimistically) that the quantum efficiency is unity i.e., that only 500 photons were needed to produce 500 photocarriers. The energy of the 500 photons is 500 h$\nu$, where $h=6.626\times10^{-34}$ joules sec., and correspondingly for $\lambda=0.6328\mu$, is $0.474\times10^{15}$/sec. This gives 500 $h\nu=0.157\times10^{-15}$ joule. Assume the viewing time is 100 nanoseconds. The optical wattage is then:

$$\frac{.157\times10^{-15}\text{ joule}}{100\times10^{-9}\text{ sec}} = .157\times10^{-8}/\text{Watts}. \quad (3)$$

This "minimum detectable" signal wattage refers to the optical power level which produces an electrical output power, after photodetection and amplification, about equal to the average noise power output. This optical input level would result in an inadmissible number of false alarms due to noise fluctuations. An allowable minimum input optical signal power is often taken to be about 12 db higher, that is, an optical power of about $0.247\times10^{-7}$ watt.

If the top of the dynamic range is to be 60 db above the minimum detectable signal (which is actually at least 10 to 15 db beyond the state of the art for such arrays), the maximum optical power entering the photoelectric element becomes $(0.247\times10^{-7})$ Watt $(10^6)=24.7$ mW. However, because of third order intermodulation effects originating within the Bragg cell medium,[3] a 60 db dynamic range requires that the diffraction efficiency be, at most, somewhat under 1%. Thus, even if all the diffracted light reached the photoelement, the laser optical output would have to exceed approximately 2.5 Watt. This laser output within a single mode is very far beyond the state of the art for a compact laser.

3. D. L. Hecht, "Multifrequency Acoustic Diffraction", IEEE Trans. on sonics and Ultrasonics, January 1977, p. 7.

Unlike solid state photoarrays, an acoustic receptor array transducer, constituting one of the array elements, and its associated RF amplifier have a much more favorable sensitivity picture. The acoustic receptor transducer itself has a noise figure near unity, producing little more than Johnson-Nyquist noise, i.e., noise power$=kT\Delta f$. It may directly feed an RF amplifier output which may typically have a noise figure of 4 to 6 db. This means that the minimum detectable input signal to the amplifier must be 4 to 6 db above Johnson noise. This follows from the definition of noise figure: If $F_{db}+\text{OUTPUT}(S/N)_{db}=\text{INPUT}(S/N)_{db}$, where F is the "noise figure in dB", and S/N is the "signal to noise ratio in dB". We define, consistent with our definition for the Bragg Cell case, the minimum detactable input signal as one which produces an output signal to noise of unity. The above expression than becomes $F_{db}=\text{INPUT}(S/N)_{db}$. But the input noise is Johnson noise, so that the input signal is $F_{db}$ above Johnson noise, i.e., above $kT\Delta f$.

Roughly averaging the 4 to 6 db amplifier noise figure to represent a power ratio of say 3, we have that the transducer must deliver a minimum signal power to the amplifier of 3 $kT\Delta f$. For a rise time of 100 nanoseconds, we have $\Delta f1/100$ nonoseconds$=10^7$/sec. Assuming T=300° K. and since $k=1.38\times10^{-23}$ Joule/° Kelvin, we have that the minimum signal into the amplifier is 3 $kT\Delta f=0.124\times10^{-12}$ Watt.

If the receptor transducer is efficiently matched, both mechanically and electrically, the corresponding minimum discernable acoustic power entering the receptor transducer may safely be assumed not to exceed about $0.5\times10^{-12}$ Watt, i.e., a conversion loss not exceeding 6 db. Since a receptor transducer corresponds to a single channel, it does not present a broadband matching problem, in contrast to the acoustic beam generating transducers conversion loss assumed here would be rather high for a narrow band matching problem, but is based on the supposition that receptor transducers may not be individually tuned. Instead, it may prove more convenient to use identical receptors over considerable subbands of the total band, e.g., the total band may consist of 3 to 10 of such sub-bands.

As was done in the Bragg cell case, we assume that the minimum useful acoustic signal input is 12 db higher, than the minimum detectable signal or $7.9\times10^{-12}$ Watt, to avoid a large number of false alarms due to noise fluctuations.

Comparing the minimum useful optical signal incident on a photoreceptor element in the Bragg cell system to the minimum useful acoustic signal incident on an acoustic array receptor element (for the same 10 MHz bandwidth), we have $2.47\times10^{-8}$ Watt =
MIN USEFUL OPTICAL INPUT PER
PHOTOARRAY ELEMENT
vs.
$7.9\times10^{-12}$ Watt =
MIN USEFUL ACOUSTIC INPUT PER ACOUSTIC
RECEPTOR ARRAY ELEMENT It is seen that the acoustic receptor element requires about 35 db less incident (acoustic signal) power than the incident (optical signal) power required by the Bragg cell system photoarray element.

The acoustic device has a total insertion loss due to the conversion losses of both input and output transducers, sound absorption by the bulk acoustic medium and losses due to some acoustic energy being incident outside of the receptor areas (e.g., falling between receptors or outside of the general receptor area because of diffraction effects). To determine a typical insertion loss, we consider some representative parameters. Suppose the band of interest is the 2 to 3 GHz region, the bulk acoustic material is lithium niobate and the unfolded acoustic path length is 10 cm (which may be much larger than what would be used, but it serves to provide an acoustic absorption loss value ("with an adequate margin for error").

The maximum attenuation occurs at the maximum frequency of 3 GHz being about 6 db for a total path of 10 cm. The conversion loss for the beam for the beam forming (beam steering) array with $f_o=2.5$ GHz and bandwidth=1 GHz would not exceed 10 db. Because it is difficult to estimate the effects of acoustic energy incident outside of the receptors, it is convenient to assume that a large part of the sound energy is incident outside of the receptor areas. This could occur, for example, if the receptors require considerable separation to reduce crosstalk. Assuming that this occurrence is responsible for a 10 db loss, the insertion loss of the device then consists of:

10 db—beam steering array conversion loss
6 db—acoustic absorption by medium
10 db—loss due to energy not incident on receptors
6 db—receptor array conversion loss Thus, a pessimistic estimate of the insertion loss is 32 db.

Since the minimum useful acoustic power incident on the acoustic receptor element is $7.9\times10^{-12}$ Watt, the minimum RF power that must be fed into the device (into the beam steering array) is 32 db above $7.9\times10^{-12}$ Watt less the 6 db receptor array conversion loss. Hence the minimum useful RF power into the device is 26 db above the $7.9\times10^{-12}$ Watt or 3.2 nW. For a 60 db dynamic range, the maximum RF input (for one carrier frequency) is therefore 3.2 mW. It can readily be shown that a Bragg cell would require, depending on various details, typically three orders of magnitude more RF power for similar performance at 60 db dynamic range. It is to be appreciated that, the photodetector array could, in fact, not respond to the required light level, even if it could be delivered.

Referring now to the drawings, reference character 10 designates a first embodiment of the invention in its simplest form. An appropriate low loss solid acoustic medium 11 is most conveniently a grown crystal. A first surface 12 supporst thereon a beam steering acoustic array 13, the individual elements 14 which are sensitive to different frequencies in a received wideband signal, and are activated by I.F. signals, different frequency components of which travel in different directions. Two individual steered beams are designated by reference characters 16 and 17, which are transmitted through the medium. Planar wavefronts 19 are refracted by the acoustic lens 20 to focus on a second surface 21 of the medium carrying a receptor array 22 lying in a spectal plane, the focused beams comprising two different frequencies falling upon individual elements 23 and 24. The acoustic lens 20 is only schematically illustrated, for purposes of clarity, and it is a curved part of the surface 12. In this embodiment it will be understood that the acoustic lens is actually formed by curving a portion of the first surface 12 to achieve the same effect.

FIG. 2 is a schematic view showing a second embodiment of somewhat different configuration. The acoustic medium 30 includes a first surface 31 having a curved portion 32 supporting the acoustic array which extends over approximately a one inch spread. The acoustic array, being on a curved surface, produces a converging beam, the direction of which is dependent upon its frequency. A typical frequency range may be 1 MHz to 2 MHz. Converging beams, one of which is indicated by reference character 34 impinge upon an opposite surface 35 having a slightly curved area 36 which corrects spherical aberration to provide further reflection wherein the beam can focus at a point 37 in a spectral plane 38 carrying acoustic receptors 39.

Figure 3:
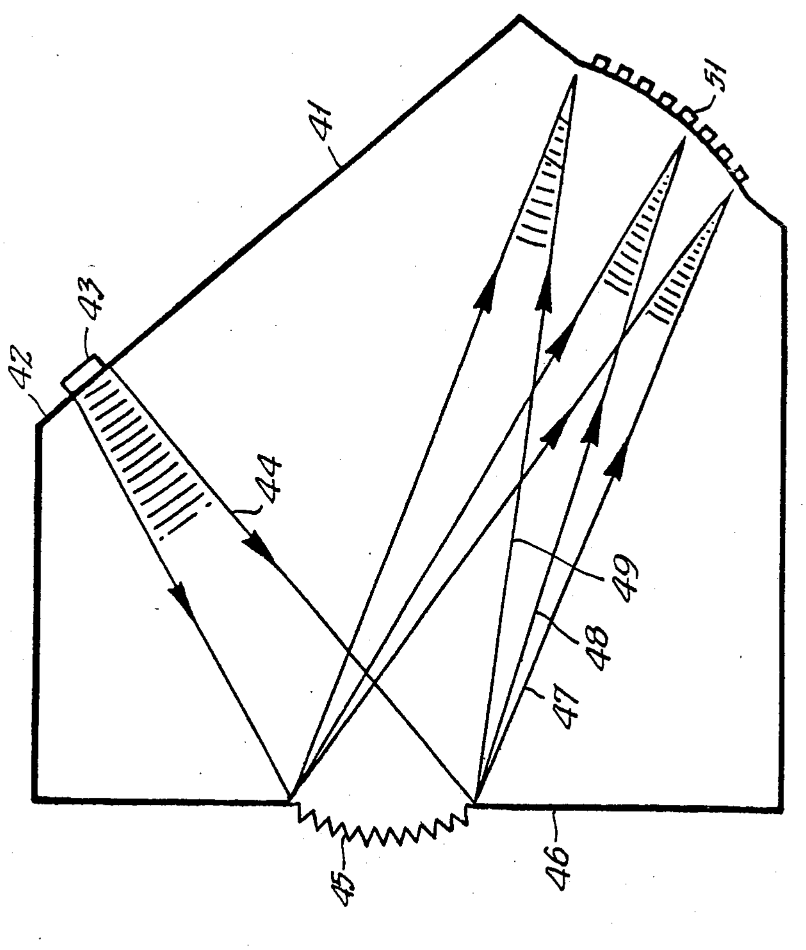
FIG. 3 is a schematic view illustrating beam steering in accordance with another embodiment of the invention.

FIG. 3 illustrates a third embodiment in which beam steering is accomplished using a reflecting diffraction grating. Here, the medium 41 is of non-rectangular cross-section, and includes a first surface 42 supporting an electric-to-acoustic transducer 43 which projects an ultrasonic beam 44 which impinges upon a concave reflective grating 45 flared to form the first order spectrum on a second surface 46. This beam does not vary in direction with frequency. A slightly divergent beam can be desirable in this geometry, using a small transducer causing divergency by diffraction. The reflected beams 47, 48, 49 of different frequency focus on an acoustic receptor transducer 51 responsive to first order spectrum to obtain an equivalent result.

Figure 4:
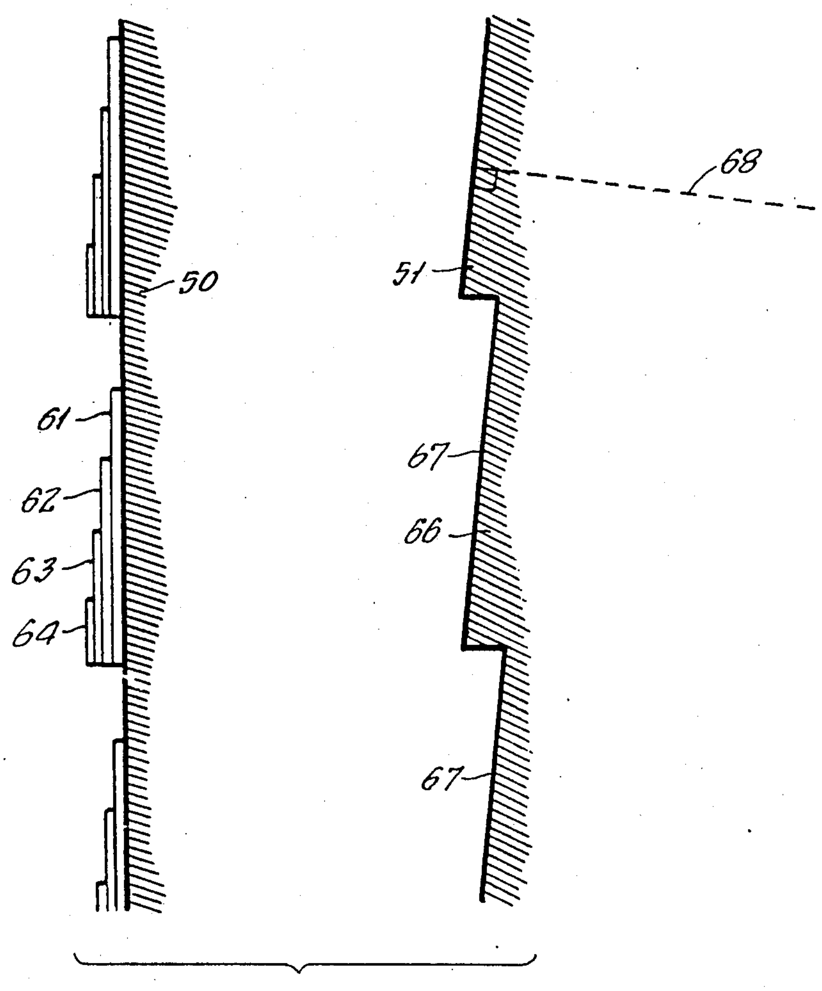
FIG. 4 is a schematic view illustrating the formation of an ultrasonic flared diffraction grating forming a component of the embodiment shown in FIG. 3.

FIG. 4 illustrates one method of forming the required ultrasonic flared diffraction grating by successively depositing surface films. The ultrasonic substrate 50 i.e., the acoustic medium has deposited thereon successive layers 61, 62, 63, and 64 using known screening techniques to form a structure equivalent to that indicated by reference character 66 having angularly disposed reflective surfaces 67 thereon. The deposited layers are of a material which is an approximate acoustic match to the acoustic substrate. They may be of the same material as the bulk medium, although unlike the substrate monocrystal, the deposited layers would be polycrystalline.

In the equivalent flared acoustic grating 51, the steps of the grating are typically a width equivalent to several wave lengths, e.g. $4\lambda$, $7\lambda$, where $\lambda$ is the mid-spectrum acoustic wave length. The depth of the steps are typically not much larger than one-quarter wave length. The direction of a typical incident ultrasonic beam is indicated by a dashed line 68.

FIGS. 5A-5E, inclusive illustrate the shaping of acoustic receptor elements to effect frequency response. This amounts to spatial filtering of the Fourier spectrum and permits achieving a desired element response curve, i.e., channel response curve, without using a bank of channel filters.

Figure 5A:
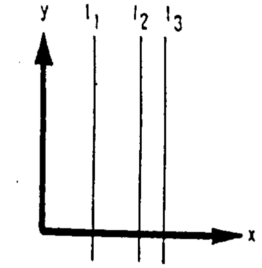
FIG. 5A is a graph illustrating an acoustic beam focal plane.

FIG. 5A illustrates the use of individual frequencies to form linear focal patterns parallel to the $\gamma$ axis, in which the X axis is the frequency axis in the focal plane. Diffraction spread of the linear patterns is not shown in the drawing.

Figure 5B:
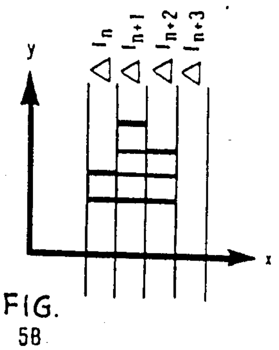
FIG. 5B is a schematic view showing a strip area of a focal plane receiving narrow frequency bands.

FIG. 5B illustrates the shaping of a receptor element to present different areas to widespread components of different frequencies in accordance with the invention. Thus, a receptor element shaped as shown in the shaded areas would present zero area to the band $\Delta l_{n+3}$. The maximum area band is $\Delta l_{n+1}$. The smallest area band is $\Delta l_n$. Receptor element shaping can be used to strongly affect the net response curve in a convenient way.

Figure 5C:
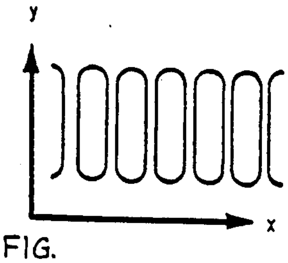
FIG. 5C is a schematic view one form of receptor elements with frequency gaps.

FIG. 5C illustrates elongated receptor elements in mutually spaced parallel relation with frequency gaps. Depending upon the spacing, the gaps, in effect disappear if the diffraction pattern for any single acoustic frequency has a wider central maximum than the spacing between the receptor elements.

Figure 5D:
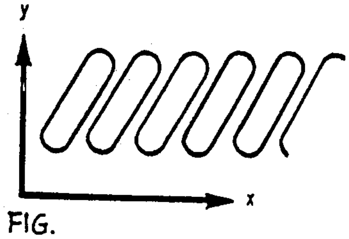
FIG. 5D is a schematic view showing receptor elements with frequency overlap.
Figure 5E:
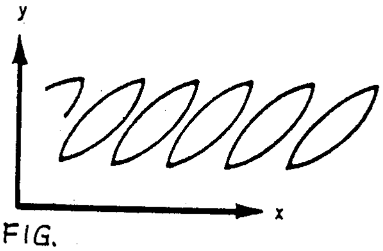
FIG. 5E is a schematic view showing frequency overlapped receptors, each favoring the mid frequencies of each recdptor.

FIG. 5D show the receptor elements of FIG. 5C in mutually inclined relation to cause frequency overlap. In FIG. 5E, the frequency receptors are overlapped, but ovate in shape to favor the mid frequencies of the range of each receptor.

Figure 6:
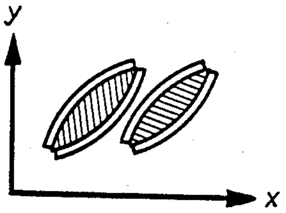
FIG. 6 is a schematic view showing frequency overlapped receptors similar to that seen in FIG. 5E, and illustrating an alternate form of receptor.

FIG. 6 illustrates a receptor similar to that shown in FIG. 5(*d*) with an alternate form of construction. In this form, the receptors are each of ovate configuration, and include a central core of piezo electric material, enclosed within parallel plates of conductive material.

It is to be understood that it is not considered that the invention is limited to the details and values shown and described in this specification, for obvious modifications will occur to those skilled in the art to which the invention pertains.

I claim:

1. In a radio frequency bulk acoustic channelizer, including an acoustic medium of hexagonal crystalline material, having a low acoustic isotropy in at least one plane therein perpendicular to the axis of hexagonal symmetry, said medium being bounded by a plurality of opposed surfaces normal to said plane; a frequency steered ultrasonic array disposed upon one of said surfaces, including plural beam radiating elements in mutually spaced relation, said one of said surfaces being curved whereby said radiating elements refract received beams to focus upon a second oppositely disposed surface; and an all acoustic receptor array, including plural receptor elements disposed upon said second oppositely disposed surface to receive focused beams of differing frequencies to effect channelization of said beams in accordance with given frequencies, the improvement comprising: said plural receptor elements each comprising a pair of small conducting parallel plates with a piezo electric material therebetween, said receptor elements being disposed in adjacent generally parallel relation; said receptor elements also being arranged in slanted relation relative to the direction of a received beam to result in frequency overlap in the band received by each receptor element; said receptor elements being of ovate configuration so as to favor the mid-frequencies of a received range of frequencies.

* * * * *